United States Patent [19]
Lin et al.

[11] Patent Number: 6,153,503
[45] Date of Patent: *Nov. 28, 2000

[54] CONTINUOUS PROCESS FOR PRODUCING SOLDER BUMPS ON ELECTRODES OF SEMICONDUCTOR CHIPS

[75] Inventors: Kwang-Lung Lin; Chih-Mei Yu; Wen-Hsiuan Chao, all of Tainan, Taiwan

[73] Assignee: National Science Council, Taipei, Taiwan

[*] Notice: This patent is subject to a terminal disclaimer.

[21] Appl. No.: 09/037,635

[22] Filed: Mar. 10, 1998

[30] Foreign Application Priority Data

Mar. 10, 1997 [TW] Taiwan ................. 86102912

[51] Int. Cl.$^7$ ................................. H01L 21/44
[52] U.S. Cl. ............................... 438/613
[58] Field of Search .................. 438/613, 612, 438/597; 427/123, 304, 305, 310; 257/737, 738, 748, 750

[56] References Cited

U.S. PATENT DOCUMENTS

| | | |
|---|---|---|
| 5,053,357 | 10/1991 | Lin et al. . |
| 5,252,180 | 10/1993 | Sang, Jr. et al. ............... 156/664 |
| 5,316,788 | 5/1994 | Dibble et al. . |
| 5,376,584 | 12/1994 | Agarwala ....................... 438/614 |
| 5,445,311 | 8/1995 | Trask et al. . |
| 5,492,235 | 2/1996 | Crafts et al. . |
| 5,511,306 | 4/1996 | Denton et al. . |
| 5,531,021 | 7/1996 | Kolman et al. . |
| 5,535,936 | 7/1996 | Chong et al. . |
| 5,638,597 | 6/1997 | Cutting et al. . |
| 5,724,728 | 3/1998 | Bond et al. . |
| 5,773,359 | 6/1998 | Mitchell et al. ................. 438/614 |
| 5,795,619 | 8/1998 | Lin et al. . |
| 5,856,705 | 1/1999 | Ting . |
| 5,874,043 | 2/1999 | Sarkel et al. . |
| 5,910,354 | 6/1999 | Meola et al. . |

OTHER PUBLICATIONS

A. Ostmann et al., "The Pretreatment of Aluminum Bondpads for Electroless Nickel Bumping", 1993 IEEE, pp. 74–78.

Inaba et al., "Solder Bump Formation Using Electroless Plating and Ultrasonic Soldering", IEEE Transactions on Components, Hybrids, and Manufacturing Technology, vol. 13, No. 1, Mar. 1990, pp. 119–123.

(List continued on next page.)

Primary Examiner—Charles Bowers
Assistant Examiner—Evan Pert
Attorney, Agent, or Firm—Bacon & Thomas

[57] ABSTRACT

A process for producing solder bumps on metal electrodes, such as Al electrodes, of a semiconductor wafer, such as silicon wafer, involves the formation of the under bump metallurgies (UBM) on the electrodes. The solder bumps are then formed on the under bump metallurgies by wave soldering. The under bump metallurgies consist of a diffusion barrier layer formed on the metal electrodes, and a wetting layer formed on the diffusion barrier layer.

2 Claims, 7 Drawing Sheets

OTHER PUBLICATIONS

Judd & Brindley, "Soldering in Electronics Assembly", Newnes Publishing, First published 1992, Chapter 3 and Chapter 7.

Lin & Chao, "Material Interactions of Solder Bumps Produced with Fluxless Wave Soldering", IEEE Transactions on Components, Packaging, and Manufacturing Technology—Part B, vol. 21, No. 1, Feb. 1998, pp. 59–64.

A. Aintila et al., "Electroless Ni/Au Bumps for Flipchip–on–Flex and TAB Applications", IEEE/CPMT Int'l Electronics Manufacturing Technology Symposium, 1994, pp. 160–164.

K. Wong et al., "Application of Electroless Nickel Plating In the Semiconductor Microcircuit Industry", Plating and Surface Finishing 75 (7), pp. 70–76.

R. Aschenbrenner et al., "Electroless Nickel/Copper Plating As a New Bump Metallization", Proceedings of the 1994 International Conference on Multi–Chip Modules, pp. 390–395.

S. M. Sze, VLSI Technology, second edition, pp. 380–417, 1988.

J. M. Oparowski et al., "The Effects of Processing Parameters on the Microstructure and Properties of Sputter–Deposited TiW Thin Film Diffusion Barriers", Thin Solid Films, 153, pp. 313–328, 1987.

Donald P. Seraphim, Ronald C. Lasky and Che–Yu Li, Principles of Electronic Packaging, 1989.

Michael Pecht, Handbook of Electronic Package Design, 1991.

CONTINUOUS PROCESS FOR PRODUCING SOLDER BUMPS ON ELECTRODES OF SEMICONDUCTOR CHIPS

FIELD OF THE INVENTION

The present invention relates generally to a process for producing solder bumps on the silicon chips in the flip chip bonding packaging technology, and more particularly to a continuous process for producing the solder bumps on the silicon chips by wave soldering.

BACKGROUND OF THE INVENTION

The development of the electronic packaging technology is a key to the advancement in performance and the miniaturization of the electronic products, such as computers, calculators, IC cards, etc. In the past twenty yeas, the Dual-In-Line Package (DIP) had played a very important role in the development of more sophisticated technologies for packaging the electronic elements. According to the DIP technology, the lead frame is bonded onto a printed circuit board by means of pins, which are implanted into the plated through holes of the printed circuit board. The bonding is further reinforced by soldering. The DIP technology has a bottleneck, which involves the production technology of the lead frame such that the input/output number of a great density is technically infeasible. In the era of 1980s, the Surface Mount Technology (SMT) was introduced in place of the DIP technology. By using the Surface Mount Technology, the input/output number of a greater density and the production automation are technically feasible. As a result, the Surface Mount Technology is a state-of-the-art technology as far as the electronic packaging technology is concerned. However, as the application of the Surface Mount Technology has reached its peak in the recent past, a new technology known as Multichip Module (MCM) has flourished in the recent years. The importance and the significance of the MCM packaging technology are witnessed by a number of research reports published by researchers around the world, as well as numerous international symposia and seminars held by academicians and technicians. In addition, the MCM packaging technology has made it possible for the electronic industry to realize the further miniaturization of the electronic products.

There are several varieties of the multichip modules, depending on the natures of the substrates, such as MCM-C (ceramic substrate), MCM-P (high molecular substrate), MCM-Si (silicon substrate), and MCM-D (film deposition), etc. On the basis of the bonding technology of the silicon chip and the substrate, the MCM technology can be divided into the wire bonding, the tape automatic bonding (TAB), and the flip chip bonding. The wire bonding and the tape automatic bonding are confined to the arrangement of the space geometry of the bonding point, so that the bonding points on a silicon chip must be located at the periphery of the chip, and thus the number of the bonding points is limited. Due to the limited number of the bonding points, the number of the bonding points on a single chip, TAB may reach 600 or so, or even fewer for wire bonding. However, the flip chip bonding may reach 1600. Such a difference as described above is due to the fact that the bonding points of the flip chip bonding can be designed as matrix, and that the surface area of the chip is fully utilized. The technology was first developed by IBM in the era of 1960s; nevertheless the technology was patented to prevent any further involvement by other members of the electronic industry until recent years.

The flip chip bonding, which is also known as the controlled collapse chip connection, $C_4$, eliminates the need of the space for wire and lead such that the chip can be directly adhered to the substrate. This technology is called the chip-on-board packaging technology or the bare chip bonding technology, which substantially reduces the need for sealing resin and promotes the input-output or the integration density of the chip as well as the chip density on the substrate to which chips are adhered. A key in the flip chip bonding technology is the solder bumps formed directly on the chip as joints must meet the requirements of the substrate circuit and the chip circuit. The solder bump is an alloy of Pb—Sn and its composition varies depending on the fabrication temperature. The solder bumps are contacted with the bump pad of the substrate by alignment. The chip is bonded onto the substrate by reflow.

The preparation of solder bumps on the chip is attained by physical vapor deposition (PVD) or electroplating, in which a desired pattern of solder bumps is first prepared by forming a patterned mask by lithography before the soldering is brought about by PVD or electroplating. The physical vapor deposition and the electroplating are defective in design in that their deposition growth is slow, and that their batch production process can not be easily automated. In addition, the thermal evaporation of the physical vapor deposition is carried out at a high temperature with a slow growth rate such that the solder bumps so produced on the chip are vulnerable to being melted. The electroplating process is more complicated than the physical vapor deposition in view of the fact that the height of the solder bumps is controlled by the current density distribution, and that the solder bumps have a flat surface which must be further treated by reflow to become an arcuate surface to facilitate the bonding.

SUMMARY OF THE INVENTION

The primary objective of the present invention is therefore to provide a cost-effective continuous process for producing solder bumps on the electrodes of semiconductor chips by wave soldering.

In order to accomplish said objective, a continuous process for producing solder bumps on electrodes of semiconductor chips according the present invention comprises the following steps:

(a) forming a diffusion barrier layer on electrodes of a plurality of semiconductor chips of a semiconductor wafer;

(b) forming a wetting layer on the diffusion barrier layer; and (c) transferring the semiconductor wafer through a molten solder wave surface such that the diffusion barrier layer and the wetting layer are faced toward the ground surface, and that the molten solder wave surface is in contact with a surface of the semiconductor wafer, the surface being provided with the diffusion barrier layer and the wetting layer, and further that solder bumps are formed only on the wetting layer and substantially no solder bumps are formed on areas other than the wetting layer and the diffusion barrier layer.

In the continuous process of the present invention said molten solder wave surface may be formed of a lead-tin alloy at a temperature ranging between 210° C. and 360° C.

Preferably, said semiconductor wafer is preheated at a temperature ranging between 150° C. and 200° C. before said semiconductor wafer is transferred through said molten solder wave surface in the continuous process of the present invention. Preferably, said semiconductor wafer is preheated for a period lasting between 20 seconds and 40 seconds.

Preferably, said semiconductor wafer is in contact with said molten solder wave surface for a period lasting between 3 seconds and 7 seconds in the continuous process of the present invention.

Preferably, said semiconductor wafer is transferred through said molten solder wave surface at a speed ranging between 1.0 m/min and 2.5 m/min in the continuous process of the present invention.

Selectively, said solder bumps formed on said wetting layer are further applied with flux, and heated to reflow so that a height of said solder bumps is increased.

Materials suitable for use as said wetting layer of the present invention, for examples, are Au, Pd, Cu, Sn, Ag, or Cr, or an alloy thereof.

Materials suitable for use as said diffusion barrier layer of the present invention include (but not limited to) Mo, MoN, Ni, electroless Ni or TiN.

In the continuous process of the present invention, said diffusion barrier layer is preferably formed by sputtering and by using a patterned photoresist as a mask which is used as a mask in forming said electrodes of said semiconductor chips. Said wetting layer is formed after the formation of said diffusion barrier layer by sputtering a material and by lifting-off said patterned photoresist mask, said material being different from a material of which said diffusion barrier layer is formed by sputtering.

DETAILED DESCRIPTION OF THE EMBODIMENTS

The process of the present invention involves the production of UBM (under bump metallurgies) on metal electrodes of a semiconductor wafer and the production of solder bumps on the UBM consisting of a diffusion barrier layer formed on the metal electrodes and a wetting layer formed on the diffusion barrier layer.

Figure 1:
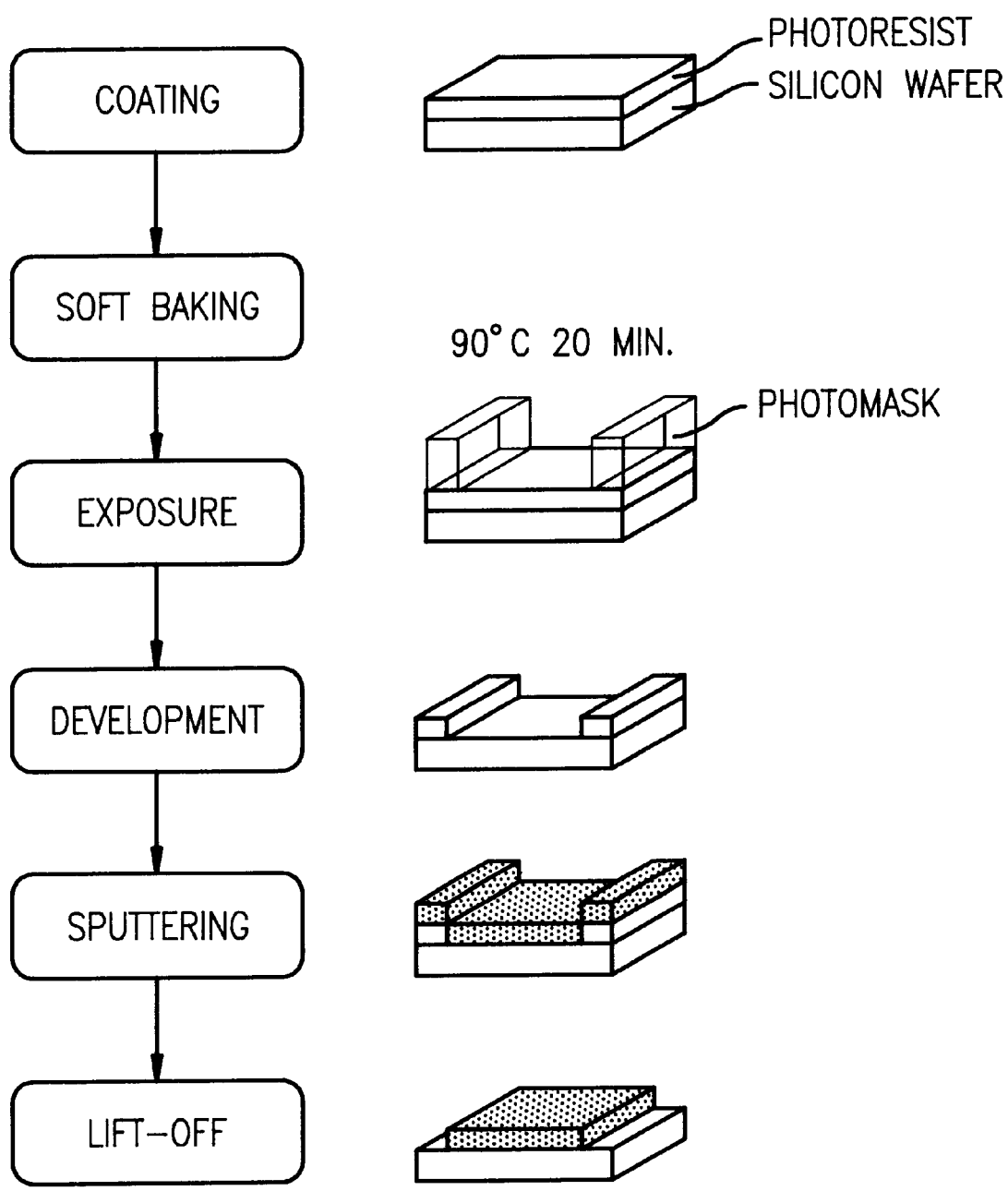
FIG. 1 shows a flow diagram of making UBM (under bump metallurgies) of the present invention.

A first preferred embodiment of forming the UBM on the metal electrodes of a semiconductor wafer is shown in FIG. 1 flow chart. As shown in FIG. 1, a silicon wafer is provided thereon with a photoresist by spin coating before the silicon wafer is soft baked at 90° C. for 20 minutes. The silicon wafer is then covered with a photo mask, such as a film of 8×8 sets of chips, with each of chips having 20×20 solder bump or a different pattern, and with each solder bump having a size of 100 μm×100 μm or 1 mm×1 mm, at an interval of 250 μm. The masked silicon wafer is subsequently exposed and developed, and then is subjected to a vacuum sputtering to form the electrodes, such as 3000 Å–5000 Å of aluminum film, and the diffusion barrier layer, such as 3000 Å–5000 Å of molybdenum film or molybdenum nitride film. A wetting layer, such as 3000 Å–5000 Å of palladium film, is formed on the diffusion barrier layer by sputtering. The sputtered wafer is treated with a solvent, such as acetone, to bring about the lift-off of the photoresist so as to obtain a wafer having patterned UBM. The solder bumps are formed on the patterned UBM by wave soldering without or in the presence of a flux.

A plurality of wafers having patterned UBM are held by the clamping device and put on the conveyer to pass a molten solder wave surface in a soldering tank of the wave soldering machine. The preheating temperature of wave soldering ranges from 150° C. to 200° C. The solder composition in the soldering tank is 63Sn-37Pb or 95Pb-5Sn. The soldering temperature of the soldering tank ranges from 210° C. to 360° C. depending on the solder composition. The wafers are transported through the conveyer at a speed of 1.0 m/min–2.5 m/min. It takes about one minute from the preheating through the formation of solder bumps.

The clamping device referred to above is made of aluminum alloy plates to form a slot corresponding in size to the wafer. The slot is provided on the inner wall thereof with the protruded edges for horizontally supporting the wafer having patterned UBM. In the process of making solder bumps, the wafer is held by the clamping device such that the wafer is located in the slot, and that the surface on which the solder bumps are to be formed is faced downward to allow the patterned UBM to be exposed from the slot of the clamping device.

The features of the present invention include the continuous formation of solder bumps on electrodes of the silicon chips, the soldering being carried out by means of the wetting layer without flux, the formation of solder bumps by using the wave soldering equipment devoid of the shortcomings of the conventional vapor deposition or electroplating, and has an advantage of rapid formation of solder bumps on electrodes of the silicon chips.

Embodiment 1:

As illustrated in FIG. 1, a silicon wafer was provided with aluminum electrodes and UBM in sequence by vacuum sputtering. The aluminum electrodes and UBM were composed of 5000 Å Al/5000 Å Mo/5000 Å Pd.

Figure 2:
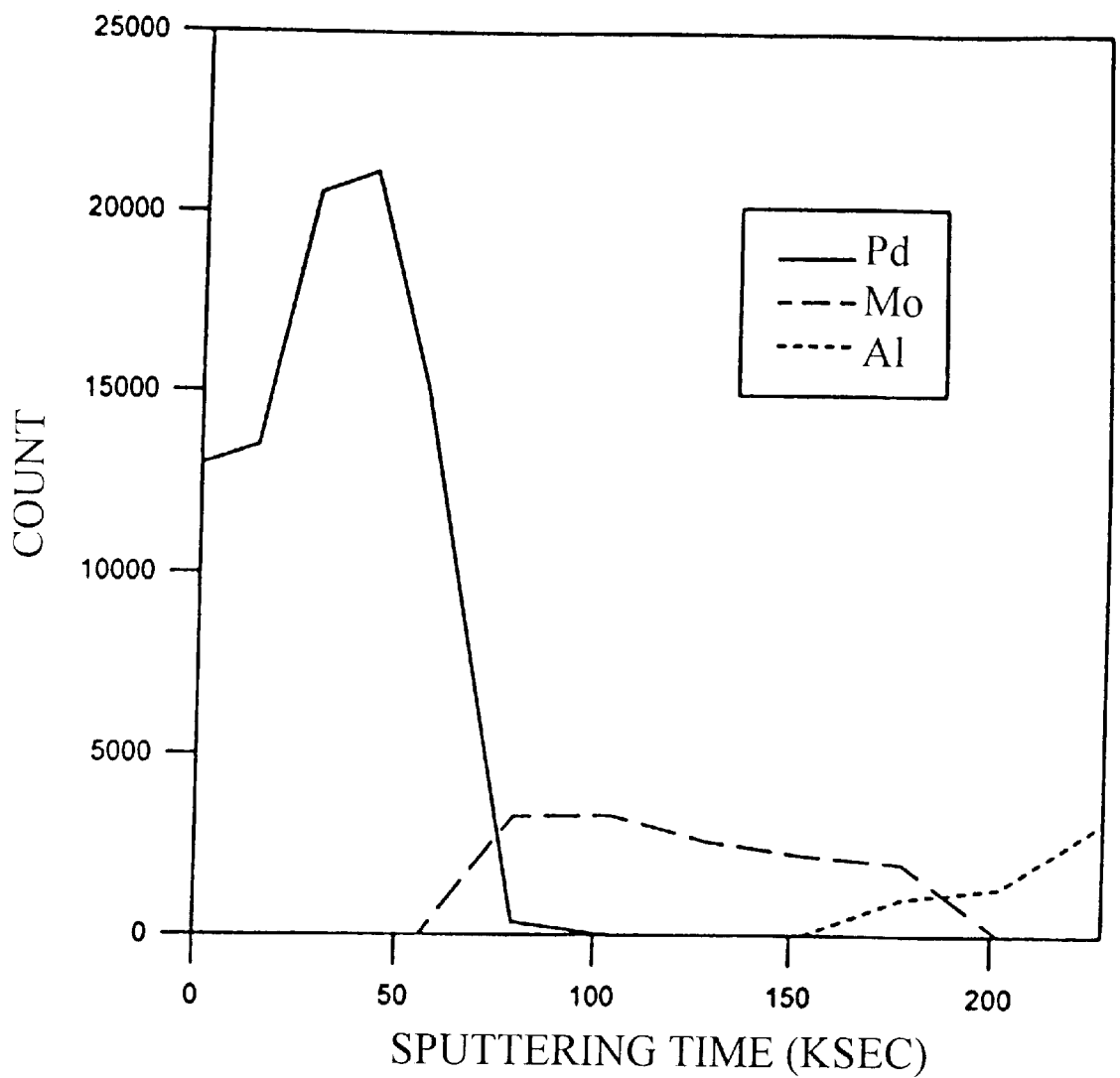
FIG. 2 shows an Auger depth profile analysis of UBM (5000 Å Al/5000 Å Mo/5000 Å Pd) of a first preferred embodiment of the present invention.

The aluminum electrodes and UBM were analyzed by the Auger depth profile, as shown in FIG. 2. There is only Pd element at the outset of analysis 50 ksec, only Mo element between 100 and 150 ksec periods, and only Al element after the period 200 ksec. It is therefore readily apparent that the aluminum electrodes and the Pd layer serving as the wetting layer are effectively separated by the Mo layer serving as the diffusion barrier layer.

Figure 3:
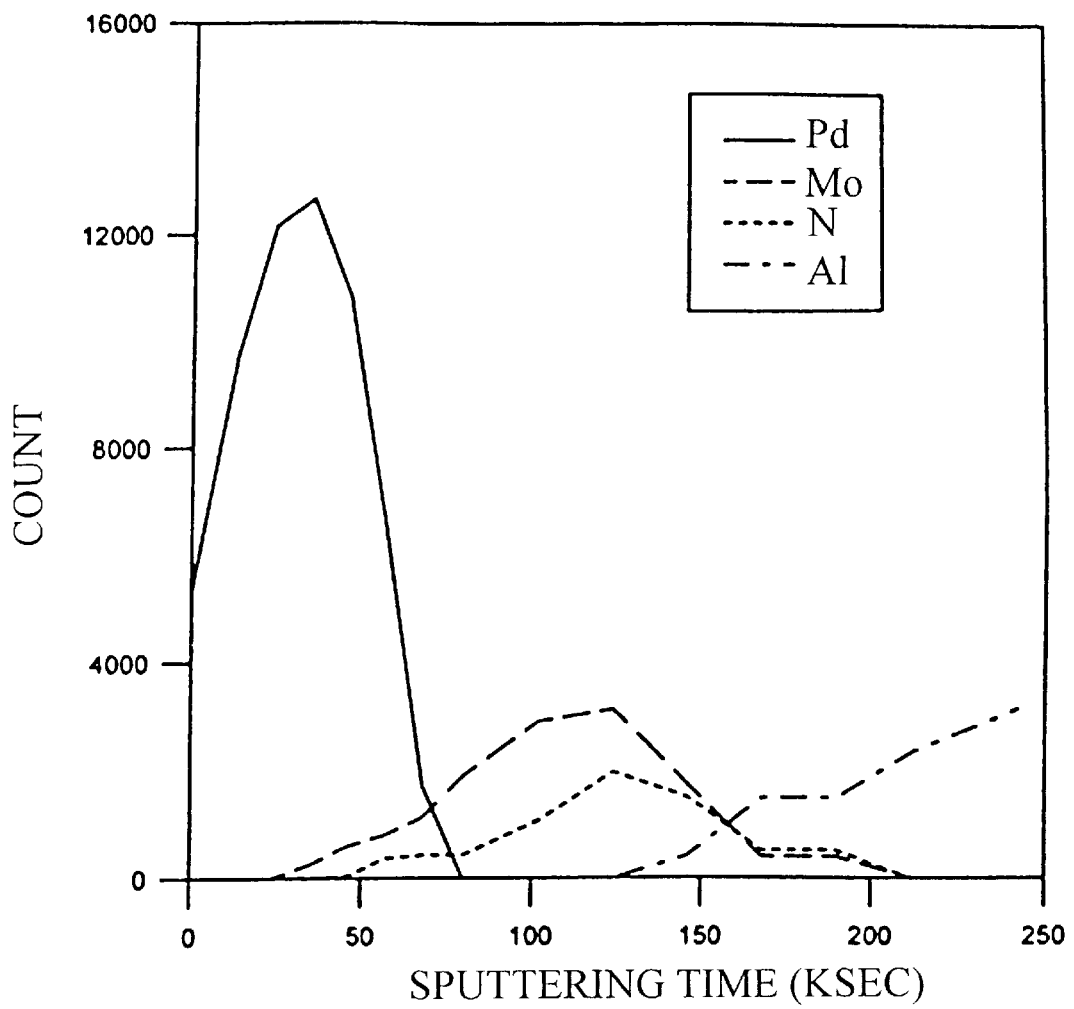
FIG. 3 shows an Auger depth profile analysis of UBM (5000 Å Al/5000 Å γ-$Mo_2$N/5000 Å Pd) of a second preferred embodiment of the present invention.

Embodiment 2:

As shown FIG. 1, a silicon wafer was provided with aluminum electrodes and UBM in sequence by vacuum sputtering. The aluminum electrodes and UBM were composed of 5000 Å Al/5000 Å γ-$Mo_2N$/5000 Å Pd. The aluminum electrodes and UBM were analyzed by the Auger depth profile, as shown in FIG. 3. The aluminum electrode and the Pd layer serving as the wetting layer are effectively isolated by the $Mo_2N$ layer serving as the diffusion barrier layer.

Embodiment 3:

According to the flow process shown in FIG. 1, a silicon wafer was provided with aluminum electrodes and UBM in sequence by vacuum sputtering. The silicon wafer was provided with 8×8 sets of silicon chips each having 20×20 pieces of the structure of 5000 Å Al/5000 Å γ-$Mo_2N$/5000 Å Pd having a size of 100 μm×100 μm.

Figure 4:
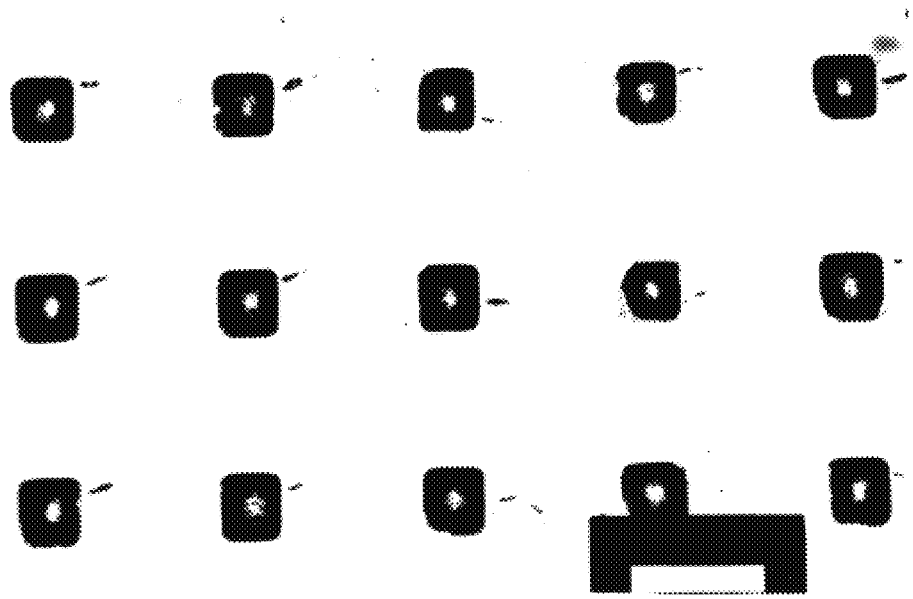
FIG. 4 shows an enlarged view of solder bumps of a silicon wafer (3.0 inches) of a third preferred embodiment of the present invention, with the silicon wafer having 8×8 sets of silicon chips each having 20×20 solder bumps of the size of 100 μm×100 μm.
Figure 5:
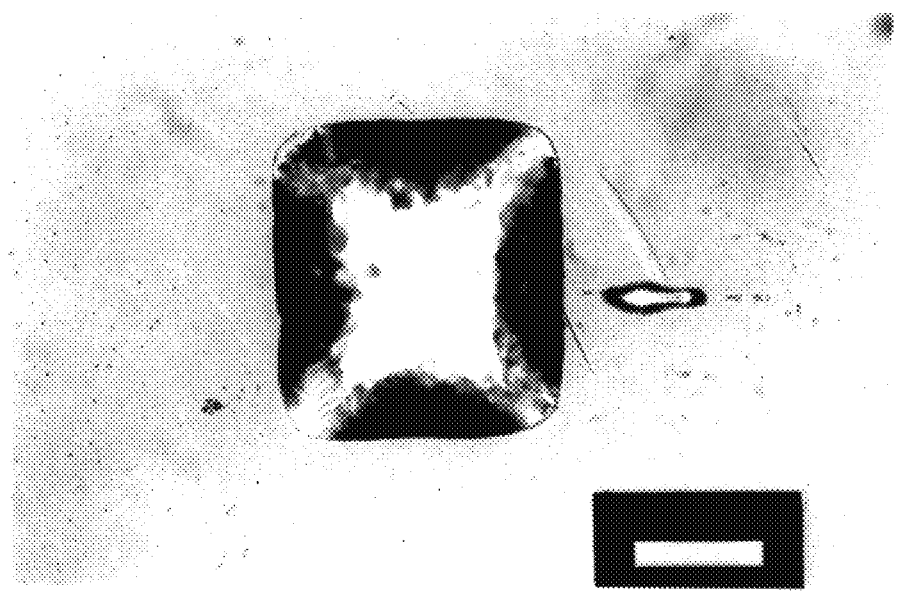
FIG. 5 shows a further enlarged view of FIG. 4.

The silicon wafer having the aluminum electrodes and UBM was held by a clamping device, which is transported by a conveyer of a wave soldering machine through a soldering wave surface of a molten 63Sn-37Pb solder in a soldering tank thereof. The preheating temperature was 150° C., the soldering tank was maintained at a temperature of 275° C., and the transportation speed was 1.9 m/min during the wave soldering. The solder bumps so formed are shown in FIGS. 4 and 5.

Figure 6:
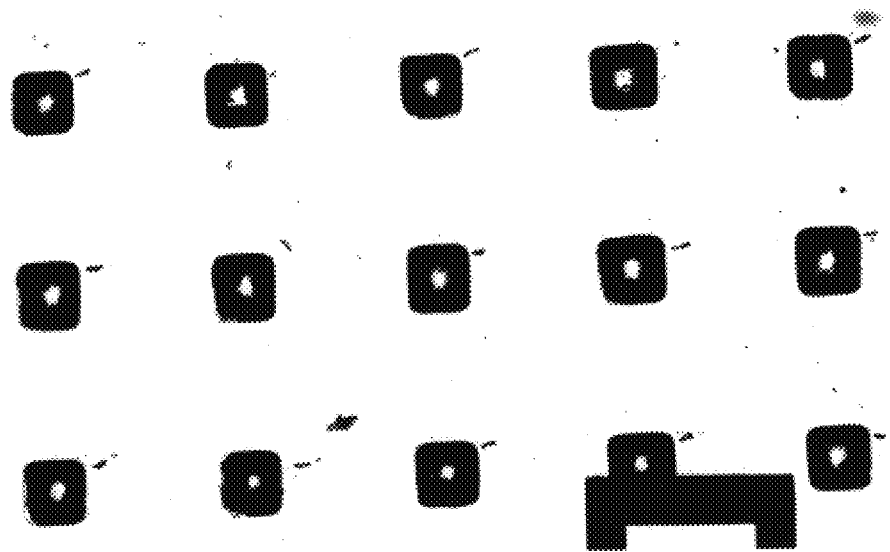
FIG. 6 shows an enlarged view of solder bumps of a 3.0-inch silicon wafer of a fourth preferred embodiment of the present invention, with the silicon wafer having 8×8 sets of silicon chips each having 20×20 solder bumps of the size of 100 μm×100 μm.
Figure 7:
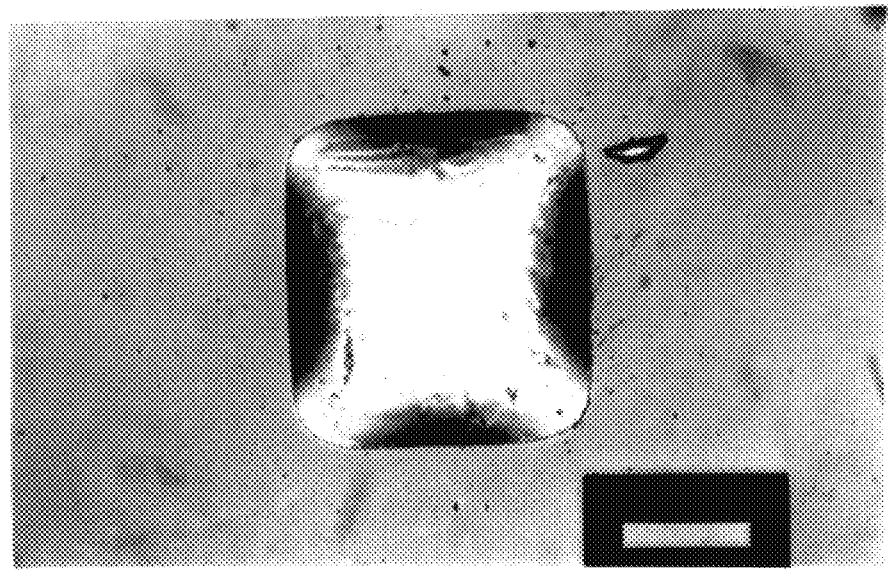
FIG. 7 shows a further enlarged view of FIG. 6.

Embodiment 4:

The procedures of Embodiment 3 were repeated except that the transportation speed was changed to 1.3 m/min. The solder bumps so formed are shown in FIGS. 6 and 7.

Figure 8:
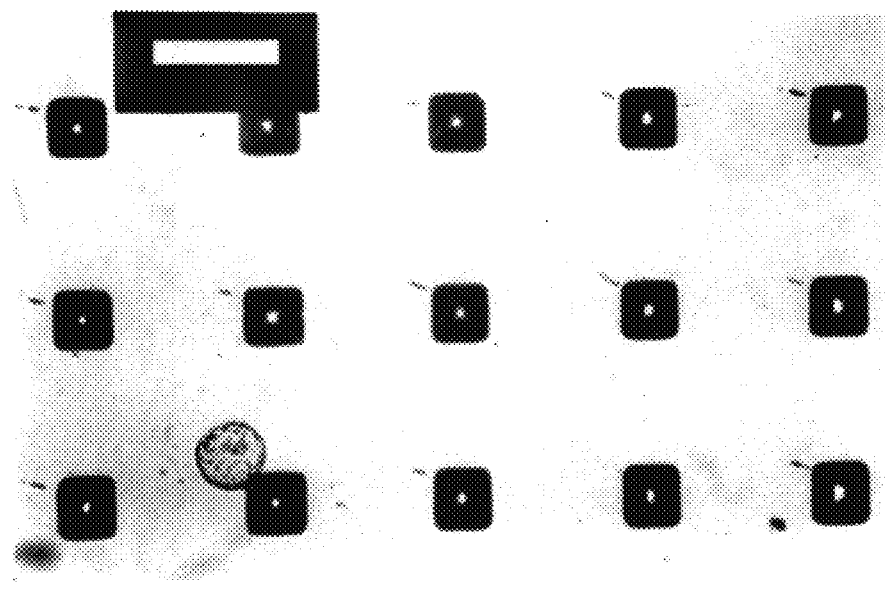
FIG. 8 shows an enlarged view of solder bumps of a 3.0-inch silicon wafer of a fifth preferred embodiment of the present invention, with the silicon wafer having 8×8 sets of silicon chips each having 20×20 solder bumps of the size of 100 pm×100 μm.
Figure 9:
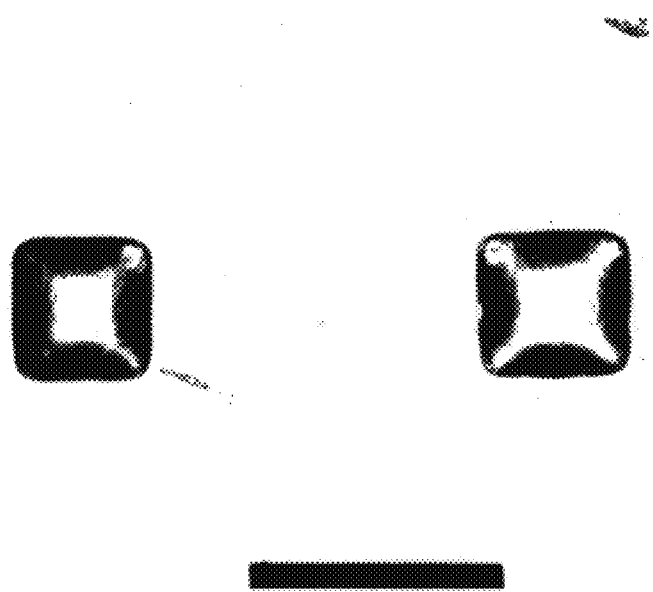
FIG. 9 shows a further enlarged view of FIG. 8.

Embodiment 5:

The procedures of Embodiment 3 were repeated except that the temperature of the soldering tank was changed to 225° C. and the transportation speed was changed to 1.3 m/min. The solder bumps so formed are shown in FIGS. 8 and 9.

Embodiment 6:

The average height of the solder bumps of Embodiments 3–5 is about 10 μm, which was increased to 20 μm or so by applying flux and reflow.

Figure 10:
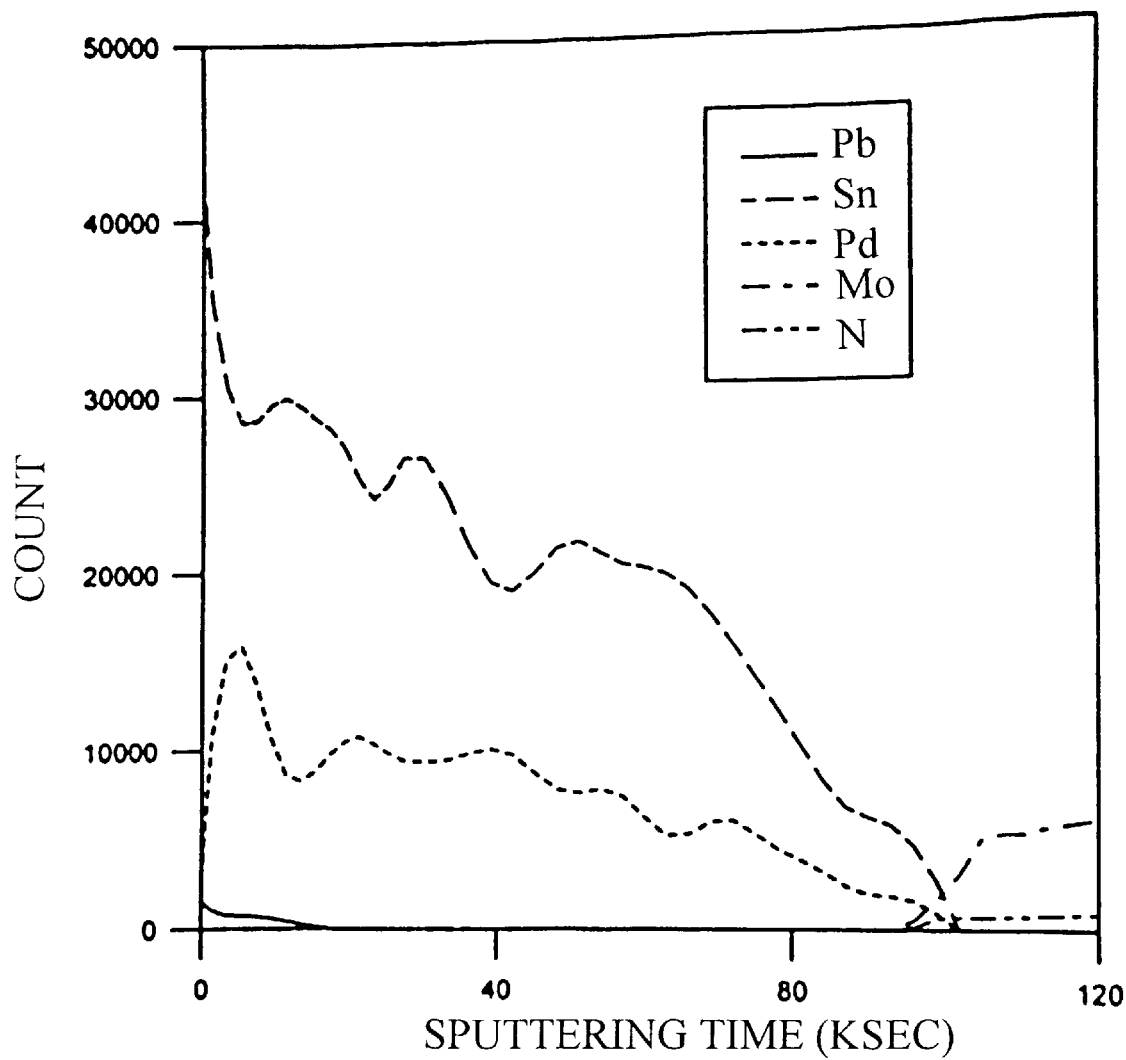
FIG. 10 shows an Auger depth profile analysis of solder bumps Al (5000 Å)/γ-$Mo_2$N (5000 Å)/Pd(5000 Å)/63Sn-37Pb of the 3.0-inch silicon wafer of the third preferred embodiment of the present invention, with the solder bumps being treated at 150° C. for 1000 hours.

Embodiment 7:

The silicon wafer having solder bumps prepared in Embodiment 3 was subjected to heating at 150° C. for 1000 hours. The solder bumps were then analyzed by the Auger depth profile, as shown in FIG. 10. There is no Al element at 120 ksec after the onset of the analysis. It is therefore readily apparent that the diffusion of solder bumps toward the aluminum electrodes is effectively prevented by the diffusion barrier layer.

The embodiments of the present invention described above are to be regarded in all respects as being merely illustrative and not restrictive. Accordingly, the present invention may be embodied in other specific forms without deviating form the spirit thereof. The present invention is therefore to be limited only by the scope of the following appended claims.

What is claimed is:

1. A continuous process for producing solder bumps on electrodes of semiconductor chips, said process comprising the following steps:

(a) forming a diffusion barrier layer on electrodes of a plurality of semiconductor chips of a semiconductor wafer, said barrier layer being formed by sputtering and by using a patterned photoresist as a mask which had been used as a mask in forming said electrodes of said semiconductor chips (b) forming a wetting layer on the diffusion barrier layer; and (c) after lifting-off of said patterned photoresist, transferring the semiconductor wafer through a molten solder wave surface such that the diffusion barrier layer and the wetting layer are faced downward, and that the molten solder wave surface is in contact with a surface of the semiconductor wafer, the surface being provided with the diffusion barrier layer and the wetting layer, and further that solder bumps are formed only on the wetting layer and substantially no solder bumps are formed on areas other than the wetting layer and the diffusion barrier layer.

2. The continuous process as defined in claim 1, wherein said wetting layer is formed after the formation of said diffusion barrier layer by sputtering a material before lifting-off said patterned photoresist mask.

* * * * *